United States Patent [19]
Warren et al.

[11] Patent Number: 5,787,576
[45] Date of Patent: Aug. 4, 1998

[54] METHOD FOR DISSIPATING HEAT FROM AN INTEGRATED CIRCUIT

[75] Inventors: James David Warren, Clayton; Carl Randall Vogt; Charles David Klooz, both of Raleigh, all of N.C.

[73] Assignee: Borg-Warner Automotive, Inc., Sterling Heights, Mich.

[21] Appl. No.: 726,315

[22] Filed: Oct. 3, 1996

Related U.S. Application Data

[62] Division of Ser. No. 509,597, Jul. 31, 1995, Pat. No. 5,590,026.

[51] Int. Cl.[6] ........................................... H05K 7/20
[52] U.S. Cl. .................. 29/832; 29/841; 257/719; 361/704; 361/719
[58] Field of Search ................. 174/16.3; 165/80.3, 165/185; 439/485, 483, 66–69; 257/706, 707, 712, 713, 718, 719, 727; 361/704–707, 713, 717–719; 29/829, 832, 841, 876

[56] References Cited

U.S. PATENT DOCUMENTS 4,756,081  7/1988  Penn .
5,061,191 10/1991  Casciotti ........................... 439/66
5,175,613 12/1992  Barker, III .
5,305,185  4/1994  Samarov et al. .
5,424,919  6/1995  Heilbronner .
5,430,609  7/1995  Kikinis .
5,473,510 12/1995  Dozier, II .
5,590,026 12/1996  Warren ............................. 361/704

*Primary Examiner*—Gerald P. Tolin
*Attorney, Agent, or Firm*—Brooks & Kushman; Greg Dziegielewski, Esq.

[57] ABSTRACT

A heat sink apparatus dissipates heat from an integrated circuit which is connected to a printed circuit board. A support member is connected to the circuit board for supporting the integrated circuit with respect to the circuit board. A metal tab in thermal communication with the integrated circuit extends from the support member in a plane substantially parallel to the circuit board. An electrically insulating thermally conductive compressible pad is positioned in contact with the metal tab for receiving heat from the tab when compressed. A thermally conductive housing is positioned adjacent the pad for compressing the pad against the tab and for receiving heat from the pad when compressed. The housing includes a plurality of fins extending therefrom for heat dissipation. A method for dissipating heat from an integrated circuit which is connected to a printed circuit board is also provided.

5 Claims, 2 Drawing Sheets

METHOD FOR DISSIPATING HEAT FROM AN INTEGRATED CIRCUIT

This is a divisional of application Ser. No. 08/509,597 filed on Jul. 31, 1995, now U.S. Pat. No. 5,590,026.

TECHNICAL FIELD

The present invention relates to heat sink devices, and more particularly to a method and apparatus for dissipating heat from an integrated circuit.

BACKGROUND OF THE INVENTION

Typically, power devices, which include an integrated circuit, used in combination with a printed circuit board, require significant heat dissipation as a result of the large power build-up in the integrated circuit. This power build-up results in special design requirements for heat-sinking the power device. Accordingly, substantial assembly time and costs result from the heat sinking design requirements.

Traditionally, power devices are attached to a printed circuit board by means of "thru-hole" technology. Using this technology, the ends of electrical connectors from the power device are inserted through holes in the printed circuit board and the electrical connectors are either manually soldered or secured by a leaded insertion machine in combination with a wave solder machine to the opposite side of the printed circuit board. Alternatively, the electrical connectors can be "surface mounted", i.e. the electrical connectors from the power device can be secured directly to the upper surface of the circuit board without the need to extend them through the circuit board. Using surface mount technology, the ends of the electrical connectors are placed in contact with solid solder and the entire circuit board is assembled using a surface mount pick-and-place machine and a reflow oven in order to melt the solder and secure the connections with the electrical connector. This process eliminates the need for the leaded insertion machine and wave solder machines. Thus, surface mount technology greatly simplifies the assembly process and reduces total capital equipment costs.

In the prior art, the power device is generally positioned perpendicular to the printed circuit board, and screws are provided to connect the tabs of the power device to the PC board housing in order to dissipate heat. The screws are inserted in a direction parallel to the printed circuit board for attaching the metal tab to the housing. Of course, this attachment requires assembly time and expense. Also, the stack-up of part variations in the printed circuit board assembly requires narrow part variation tolerances for the various components of the assembly.

Accordingly, it is desirable to provide an improved method and apparatus for dissipating heat from a power device. It is further desirable to facilitate use of the surface mount technology for attachment of the power device to the printed circuit board. Additionally, it is desirable to provide a printed circuit board assembly with relaxed part tolerances for various components of the assembly.

DISCLOSURE OF THE INVENTION

The present invention overcomes the above-referenced problems experienced in prior art printed circuit board assemblies by providing a printed circuit board with a surface mounted power device which includes a metal tab in thermal communication with the silicon integrated circuit. The metal tab extends substantially parallel to the printed circuit board, which enables the novel use of a compressible thermal pad between the metal tab and the heat sink housing. The electrically insulating thermally conductive pad is compressed between the metal tab and the aluminum housing in order to carry heat from the metal tab into the aluminum housing for heat dissipation. The compressible pad conducts heat away from the electronics into the heat sink, electrically isolates the electronics from the housing, and absorbs the combined tolerances of all items in the assembly stack-up, thereby allowing relaxed part tolerances for the various assembly components.

More specifically, the present invention provides an apparatus for dissipating heat from a silicon integrated circuit (IC) which is connected to a printed circuit (PC) board. The apparatus comprises a support member connected to the PC board for supporting the IC with respect to the PC board. A metal tab in thermal communication with the IC extends from the support member in a plane substantially parallel to the PC board. A low durometer electrically insulating thermally conductive compressible pad is positioned in contact with the metal tab for receiving heat from the tab when compressed. A thermally conductive housing is positioned adjacent the pad for compressing the pad against the tab and for receiving heat from the pad when compressed. The housing acts as a heat sink for dissipating heat.

The present invention also provides a method for dissipating heat from a power device which includes an integrated circuit which is connected to a printed circuit board having a housing. The method comprises the following steps: (1) mounting the power device to the printed circuit board, the power device having a metal tab in thermal communication with the IC and extending from the IC in a plane substantially parallel to the printed circuit board; (2) attaching a low durometer thermally conductive electrically insulating pad to the housing; and (3) attaching the thermally conductive housing to the printed circuit board, with the pad positioned between the metal tab and the housing to transfer heat from the integrated circuit to the housing.

The present invention has particular use relative to electronic four-wheel drive transfer case controllers. It also has general applicability to printed circuit board assemblies with power device heat sink requirements.

Accordingly, an object of the present invention is to provide a method and apparatus for heat sinking a power device which allows surface mounting of the power device on the printed circuit board.

Another object of the present invention is to provide a method and apparatus for heat sinking a power device through an aluminum housing which reduces assembly costs.

A further object of the present invention is to provide a method and apparatus for transferring heat from a power device to a circuit board housing in a manner which absorbs the combined tolerances of various assembly components in the assembly stack-up.

The above objects and other objects, features and advantages of the present invention are readily apparent from the following detailed description of the best mode for carrying out the invention when taken in connection with the accompanying drawings.

DETAILED DESCRIPTION OF THE INVETION

Figure 1:
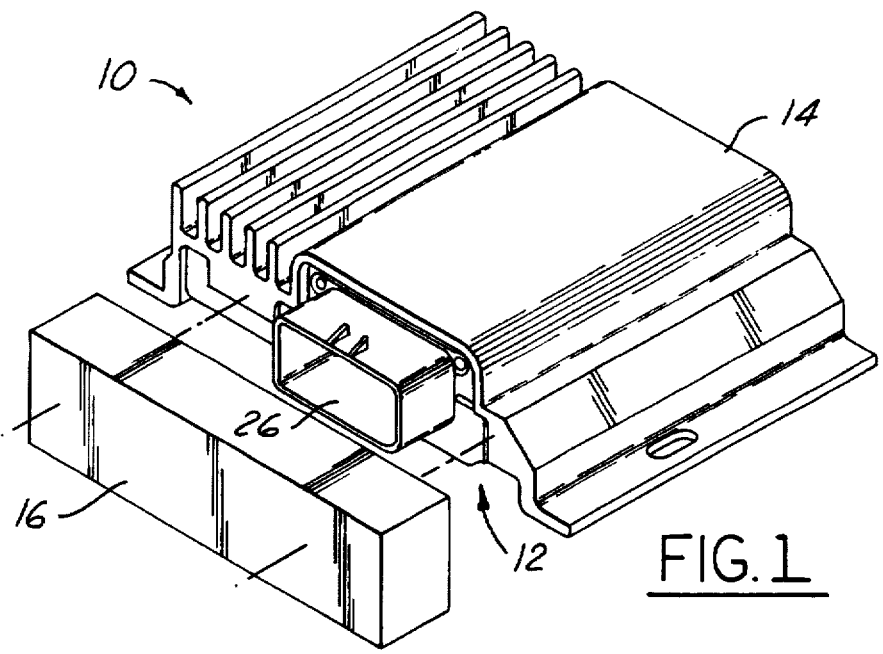
FIG. 1 shows a partially exploded perspective view of a printed circuit board assembly including a heat sink housing in accordance with the present invention.
Figure 2:
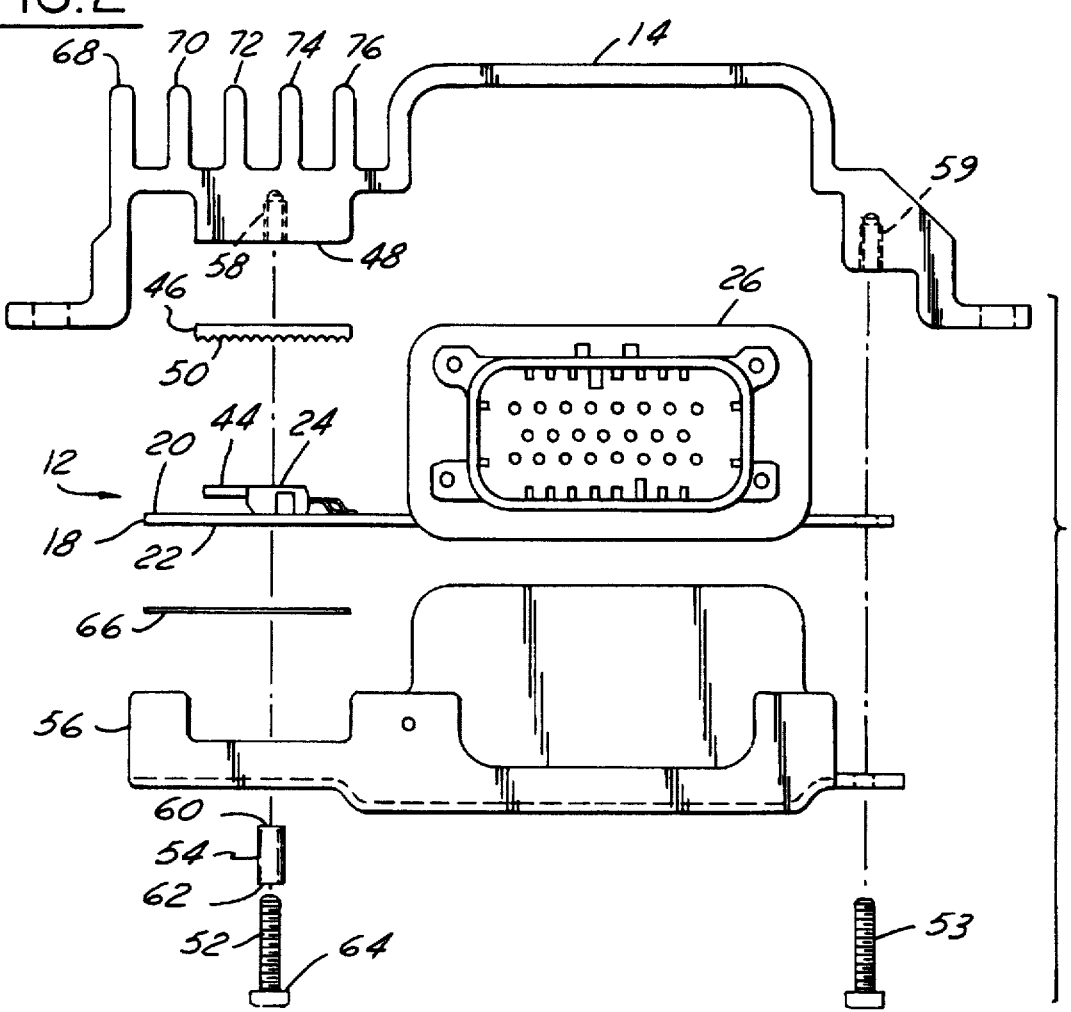
FIG. 2 shows an exploded side view of a printed circuit board assembly with an apparatus for dissipating heat in accordance with the present invention.

FIGS. 1 and 2 show an apparatus 10 for dissipating heat from a silicon integrated circuit (IC) which is connected to a printed circuit board assembly 12. The printed circuit board assembly 12 is enclosed by a heat dissipating housing 14 and an end cap 16.

The printed circuit board assembly 12 includes a printed circuit board 18 having first and second sides 20,22. A power device 24 is surface mounted on the first side 20 of the printed circuit board 18. The printed circuit board assembly 12 further includes an electrical connector 26. The power device 24 contains a silicon integrated circuit (IC) 38, and the printed circuit board 12 contains control logic in the form of a microprocessor to control the IC.

Figure 3:
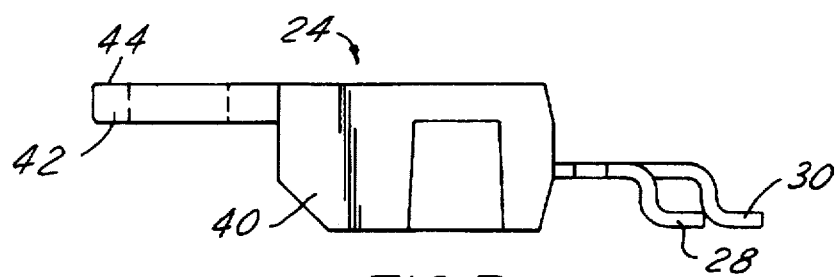
FIGS. 3 and 4 show a side view and bottom view, respectively, of a power device in accordance with the present invention.
Figure 4:
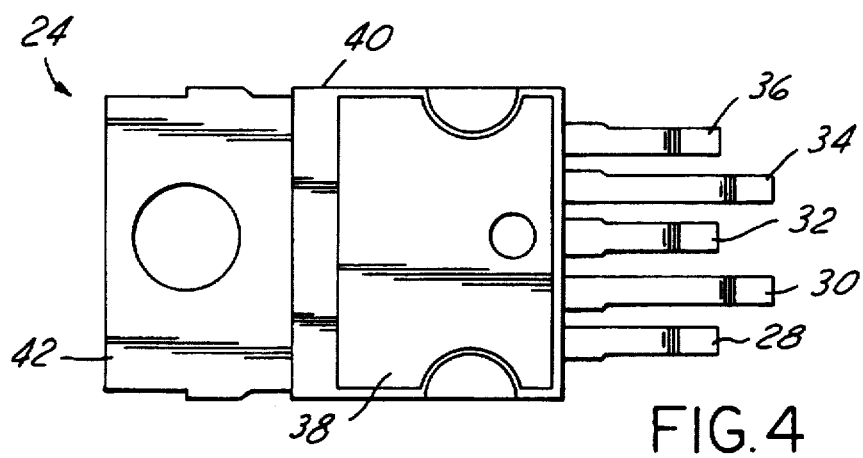

The power device 24 is more clearly shown in FIGS. 3 and 4. The power device 24 includes a plurality of electrical connectors 28,30,32,34,36 which are surface mounted to the printed circuit board 18 by placing the power device 24 on the first side 20 of the printed circuit board 18 with the electrical connectors 28,30,32,34,36 positioned in contact with solid solder on the first surface 20. The circuit assembly 12 is then heated in an oven to reflow the solder in order to create an electrical connection between the electrical connectors 28,30,32,34,36 and the printed circuit board 18. The electrical connectors 28,30,32,34,36 are in electrical communication with the silicon integrated circuit (IC) 38.

The silicon integrated circuit 38 is a device which performs circuit switching on the printed circuit board 18. The silicon integrated circuit 38 is supported within a plastic housing 40. A metal tab 42 is connected in thermal communication with the silicon integrated circuit 38, and extends from the plastic housing 40 in a plane spaced from and substantially parallel to the printed circuit board 18.

Figure 5A:
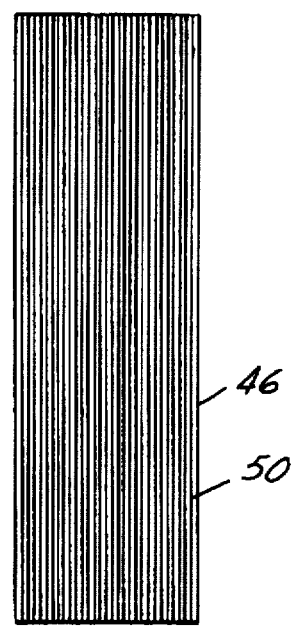
FIGS. 5A–5C show a plan view, side view and end view, respectively, of a compressible thermal pad in accordance with the present invention.
Figure 5B:
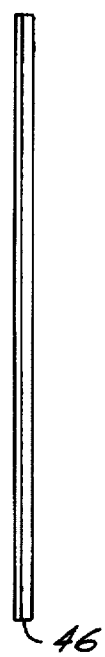
Figure 5C:
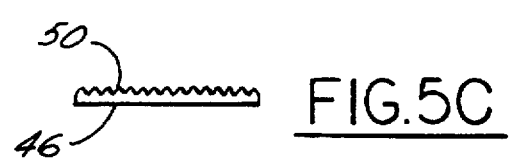

The metal tab 42 includes an upper surface 44 which is engageable with an electrically insulating thermally conductive compressible pad 46. The pad 46 is shown in detail in FIGS. 5A–5C. When compressed, the pad 46 becomes thermally conductive, and carries heat from the metal tab 42 into the housing 14, while electrically isolating the electronics from the housing. The compressible pad 46 is adhesively secured to a lower surface 48 of the housing 14. The compressible pad 46 preferably is a low durometer thermally conductive elastomer known as "Cho-Therm T274 ribbed", available from FabriTech Incorporated of Westchester, Pennsylvania. A thermally conductive pressure sensitive acrylic adhesive secures the compressible pad 46 to the lower surface 48 of the aluminum housing 14. The compressible pad 46 includes a plurality of ribs 50 extending therefrom for deformation against the metal tab 42.

The thermal pad 46 also serves as a tolerance absorber to prevent stress on the printed circuit board 18 and power device 24. The compressibility of the thermal pad 46 allows for greater tolerances of the other components in the assembly, thereby increasing the maximum stack-up tolerance of the assembly, which relaxes tolerances for the individual components. Prevention of stress on the printed circuit board 18 and power device 24 is accomplished by a plurality of standoff sleeves 54 (only one sleeve shown in FIG. 2). A plurality of screws 52,53 extend from the steel base plate 56 through apertures 58,59 formed in the heat dissipating housing 14. The standoff sleeve 54 includes a first end 60, which is engageable with the lower surface 48 of the housing 14. The standoff sleeve 54 also includes a second end 62, which is engageable with the screw head 64. Accordingly, the length of the standoff sleeves 54 dictates the spacing between the lower surface 48 of the housing 14 and the screw head 64, thereby providing the stack-up dimension for the assembly. The length of a second sleeve (not shown) is also selected in the same manner. The standoff 54 prevents overcompression of the thermal pad 46 and also prevents bending of the printed circuit board 18. Accordingly, the standoff 54 basically provides a stop means.

Preferably, the compressible pad 46 is 0.062 inches thick and achieves a desired thermal resistance of 3.5 watts per degree centigrade. The thermal pad 46 also electrically isolates the electronics of the printed circuit board 18 and power device 24 from the housing 14.

The assembly further includes a paper insulator 66 positioned between the steel base plate 56 and the printed circuit board 18 to prevent short circuits from occurring therebetween.

Accordingly, in operation, heat from the silicon integrated circuit 38 passes into the metal tab 42, and is carried to the metal housing 14 by the thermal pad 46. The housing 14 includes a plurality of fins 68,70,72,74,76 extending therefrom in order to increase the surface area of the housing 14 to facilitate dissipation of heat.

Alternatively, a plurality of power devices may be secured to the circuit board in side-by-side relationship. The metal tabs of adjacent power devices could be arranged in oppositely extending directions to facilitate even pressurized contact with the compressible pad 46.

The present invention has substantial advantages over prior art assemblies in that the parallel disposition of the metal tab 42 with respect to the printed circuit board 18 enables use of the thermal pad 46 and enables surface mounting of the power device. Since the thermal pad 46 is adhesively secured to the lower surface 48 of the heat dissipating housing 14, assembly time is minimized. Formerly, power devices 24 were assembled perpendicular with respect to printed circuit boards, thereby requiring lateral insertion of a screw in order to thermally communicate the power device with the heat dissipating housing. The present invention alleviates that assembly problem while electrically isolating the electronics from the housing and absorbing the combined tolerances of the various assembly components in the assembly stack-up.

While the best mode for carrying out the invention has been described in detail, those familiar with the art to which this invention relates will recognize alternative designs and embodiments for practicing the invention. Thus, the above described preferred embodiment is intended to be illustrative of the invention which may be modified within the scope of the following appended claims.

What is claimed is:

1. A method for dissipating heat from an integrated circuit which is connected to a printed circuit board, the printed circuit board having a thermally conductive housing, the method comprising:

surface mounting the integrated circuit to the printed circuit board, said integrated circuit having a support member with a metal tab extending therefrom, said metal tab extending from the integrated circuit in a plane substantially parallel to the printed circuit board;

positioning a thermally conductive electrically insulating pad on said housing; and attaching the thermally conductive housing to the printed circuit board, said housing compressing said pad against said metal tab, and said housing having fins extending therefrom for heat dissipation.

2. The method for claim 1, further comprising preventing overcompression of said pad by providing a standoff means for restricting compressive movement of the housing toward the metal tab.

3. The method of claim 1, wherein said step of mounting the integrated circuit to the printed circuit board comprises surface mounting the integrated circuit to the circuit board.

4. A method for dissipating heat from an integrated circuit which is connected to a printed circuit board having a housing and a base, the method comprising:

mounting the integrated circuit on the printed circuit board, said integrated circuit having a metal tab extending therefrom substantially parallel to the printed circuit board, positioning the printed circuit board on the base, attaching a thermally conductive electrically insulating compressible pad to the housing; and attaching the housing to the base with the compressible pad positioned between the metal tab and the housing for transferring heat from the integrated circuit to the housing.

5. The method of claim 4, wherein said step of mounting the integrated circuit comprises surface mounting the integrated circuit on the printed circuit board.

* * * * *